(12) United States Patent
Tatsuta (10) Patent No.: US 7,317,744 B2
(45) Date of Patent: Jan. 8, 2008

(54) OPTICAL HEAD APPARATUS

(75) Inventor: Nobuhiro Tatsuta, Oura-Gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 352 days.

(21) Appl. No.: 11/074,382

(22) Filed: Mar. 7, 2005

(65) Prior Publication Data

US 2005/0201434 A1   Sep. 15, 2005

(30) Foreign Application Priority Data

Mar. 12, 2004  (JP)  .............................. 2004-070694

(51) Int. Cl.
   *H01S 3/00*   (2006.01)
(52) U.S. Cl. .................................. 372/38.02; 372/38.1
(58) Field of Classification Search ............. 372/38.02, 372/38.07

See application file for complete search history.

(56) References Cited

U.S. PATENT DOCUMENTS 6,421,314 B1 *  7/2002  Maruyama .................. 369/116

2004/0047273 A1 *  3/2004  Kitano ........................ 369/121

FOREIGN PATENT DOCUMENTS

JP        2003-99969         4/2003

* cited by examiner

*Primary Examiner*—Dung (Michael) T. Nguyen
(74) *Attorney, Agent, or Firm*—Pillsbury Winthrop Shaw Pittman LLP (57) ABSTRACT

A laser driver is configured so as to disperse into a main circuit which generates a control signal to drive first and second semiconductor lasers, and first and second sub circuits having first and second final driving stages which drive, in accordance with the control signal, the first and second semiconductor lasers, respectively, and the main circuit comprises a selection circuit which selectively supplies the control signal to the sub circuits to be operated in conformity with the kind of recording medium, and the first sub circuit is placed closer to a connection area to the first semiconductor laser of a flexible circuit board than the main circuit or placed on this connection area; and the second sub circuit is placed closer to a connection area to the second semiconductor laser of the flexible circuit board than the main circuit or placed on this connection area.

4 Claims, 6 Drawing Sheets

OPTICAL HEAD APPARATUS

CROSS-REFERENCE TO RELATED APPLICATION

The entire disclosure of Japanese Application No. 2004-70694 including specification, claims, drawings and abstract is incorporated herein by reference.

BACKGROUND OF THE INVENTION

1. Field of the Invention

The present invention relates to an optical head apparatus comprising first and second laser diodes to emit laser lights adapted to different first and second recording media, respectively, wherein a laser driver for driving the first and second laser diodes is placed in an optical housing in which the first and second laser diodes are incorporated.

2. Description of the Related Art

An optical head apparatus which applies laser light to a recording medium such as a disk to optically read and/or write signals includes an apparatus that comprises a plurality of kinds of different laser diodes to emit laser lights having wavelengths suitable for recording densities of recording media so as to accommodate the recording media having different recording densities, for example, both a DVD and a CD.

Such an optical head apparatus comprising the plurality of laser diodes may be separately provided with laser driving semiconductor integrated circuits (laser drivers) which configure the laser drivers for driving laser diodes, or may be provided with a single laser driver having laser driver functions to drive the respective laser diodes. At present, the latter mode is common (refer to Japanese Patent Publication Laid-open No. 2003-99969).

In the meantime, the optical head apparatus is supported movably in a direction traversing a signal track of the recording medium. A flexible circuit board is used to connect the optical head apparatus to a circuit board installed in an equipment main body in which the optical head apparatus is mounted. This flexible circuit board is used to communicate electric signals across various kinds of electrical components mounted on the optical head apparatus and the above-mentioned circuit board.

In the flexible circuit board, various electrical components are mounted along the optical head apparatus in an area attached to the optical head apparatus. More specifically, the laser diodes incorporated into the optical head apparatus, a photo-detector which receives laser light reflected from the recording medium, a front monitor diode to monitor the amount of emission from the laser diodes, and the like are connected.

Furthermore, as the laser driver needs to be disposed in proximity to the laser diodes to reduce deterioration of drive pulse signals and effects of undesirable radiation, it is also, in many cases, disposed in and connected to the area of the flexible circuit board attached to the optical head apparatus.

The positions of the various electrical components mounted on the optical head apparatus are set considering the outer shape of the optical head apparatus, an optical layout and a connection relation among the various electrical components or considering that the flexible circuit board will be bent. Moreover, the size is limited depending on the outer shape of the optical head apparatus, so that the flexible circuit board will have a complicated shape in which connection portions to be connected to the respective electrical components branch in all directions.

Incidentally, the optical head apparatus adapted to record and reproduce signals of DVDs and CDs is generally provided with laser diodes exclusive to DVDs and CDs, respectively. The DVD laser diode and CD laser diode are often arranged away from each other on the optical head apparatus in relation to the optical layout.

As there is a dual wavelength semiconductor laser which emits laser lights at different wavelengths, it is contemplated that this dual wavelength semiconductor laser could be used to conform to DVDs and CDs. On the other hand, a disk standard has recently emerged which uses a blue laser beam to record and reproduce high-density signals. If an optical head apparatus conforming to this high-density disk standard is provided, compatibility is required with DVDs and CDs which are not high density. Therefore, a plurality of semiconductors are required after all, and a plurality of laser diodes are disposed at separate positions of the optical head apparatus.

When the single laser driver drives a plurality of laser diodes, it is difficult to dispose the laser driver in proximity to all the laser diodes. This leads to problems including waveform deformation of the drive pulse signals caused by the laser diodes being disposed away from the laser driver and undesirable radiation attributable to the drive pulse signals.

On the other hand, when the laser drivers adapted to a plurality of laser diodes are used to independently drive the respective laser diodes, it is difficult to secure areas to place the plurality of laser drivers on the flexible circuit board.

Japanese Patent Publication Laid-open No. 2003-99969 mentioned above shows an optical head apparatus wherein a laser driver is provided which has, at final stages, a plurality of amplifier circuits to amplify a current for each laser diode and wherein the final stages are selectively operated to drive a desired laser diode. This can prevent the waveform deformation of the drive pulse signals by disposing each of the final stages in the proximity of the corresponding laser diode.

However, the optical head apparatus disclosed in Japanese Patent Publication Laid-open No. 2003-99969 mentioned above only shows that the laser driver is placed in the optical head apparatus, and does not have any concept to place the laser driver on the flexible circuit board. In addition, a switching circuit which selectively operates the final stage corresponding to each of the laser diodes is not disposed in the proximity of each of the laser diodes. Thus, since the level of currents running from the final stages via the switching circuit will be the current level of the drive pulse signals which drive the laser diodes, the problem of the undesirable radiation attributed to the drive pulse signals is not solved.

Furthermore, the laser diodes for ultra-red laser and a red laser used for CDs and DVDs have different on-voltages depending on the kind. For this reason, when a common laser driver is used to drive the respective laser diodes, the power supply voltage of the laser driver needs to be set in accordance with the one with a higher on-voltage. In this case, due to the power wastefully consumed in the driving of the CD laser diode conforming to the laser diode with a lower on-voltage, the power consumption of the laser driver is increased.

The increase in the power consumption at the laser driver directly leads to a problem in heat generation, which requires some measures to be taken. In particular, the on-voltage of the blue laser diode conforming to the high-density disk standard described above is further higher than that of a laser diode for red laser light. Therefore, if the laser driver to drive the laser diodes for the ultra-red laser and red laser is used in common to drive the blue laser diode, the power supply voltage of the laser driver needs to be further increased. If the laser diodes for the ultra-red laser and red laser are driven in that state, the power wastefully consumed in the laser driver is further increased, and heat generation will be a more serious problem.

BRIEF SUMMARY OF THE INVENTION

In the present invention, a laser driver is configured so as to disperse into a main circuit which is shared by first and second semiconductor lasers and which generates a control signal to drive the first and second semiconductor lasers, and first and second sub circuits having first and second final driving stages which drive the first and second semiconductor lasers, respectively, in accordance with the control signal supplied from the main circuit, wherein the main circuit comprises a selection circuit which selectively supplies the control signal to the sub circuits to be operated in conformity with the kind of recording medium; the main circuit is placed at a predetermined position of a flexible circuit board; the first sub circuit is placed closer to a connection area to the first semiconductor laser of the flexible circuit board than the main circuit or placed on this connection area; and the second sub circuit is placed closer to a connection area to the second semiconductor laser of the flexible circuit board than the main circuit or placed on this connection area. Thus, while the main circuit can be disposed on the flexible circuit board away from the first and second semiconductor lasers, the control signal for selectively operating the first and second sub circuits runs across the main circuit and the first and second sub circuits on the flexible circuit board.

In the optical head apparatus according to the present invention, the laser driver is configured so as to disperse into the main circuit and the first and second sub circuits, and while the main circuit can be disposed on the flexible circuit board away from the first and second semiconductor lasers, the control signal for selectively operating the first and second sub circuits runs across the main circuit and the first and second sub circuits on the flexible circuit board. This can prevent the delay and waveform deformation of the drive pulse signals supplied to the semiconductor lasers, and significantly decrease the level of the signal running from the main circuit to the first and second sub circuits to reduce undesirable radiation attributable to the drive pulse signals.

Furthermore, since the main circuit of the laser driver comprises a high frequency superimpose circuit, it is not necessary to supply the first and second sub circuits with the high-speed and weak control signal that controls the oscillation of the high frequency superimpose circuit. Thus, the delay and waveform deformation of this control signal do not cause a problem that the high frequency superimpose circuit can not be controlled.

Still further, a DC-DC converter provided in the main circuit switches, in accordance with the kind of recording medium, the power supply voltage to be supplied to each of the sub circuits to a value which is set in consideration of the on-voltage of laser diodes constituting the semiconductor laser adapted to the kind of recording medium. Thus, an optimum power supply voltage can be applied to each of the sub circuits for each laser diode to be driven, and electric power is prevented from being wastefully consumed by the sub circuits, which is also an advantage in terms of heat generation.

Further still, the laser driver comprises a single main circuit and a plurality of sub Circuits, and NPN and PNP transistors or N-channel and P-channel FETs are suitably used to configure each of the sub circuits in accordance with the on-voltage of the laser diode driven by each of the sub circuits. Therefore, NPN and PNP transistors or N channel and P channel FETs (Field Effect Transistors) can be suitably used to configure the respective sub circuits. In other words, the type of transistors or FETs with advantageous characteristics can be suitably used for the laser diode to be used so as to configure the respective sub circuits.

BRIEF DESCRIPTION OF THE SEVERAL VIEWS OF THE DRAWINGS

Preferred embodiment(s) of the present invention will be described in further detail based on the following drawings, wherein.

DETAILED DESCRIPTION OF THE INVENTION

Figure 1:
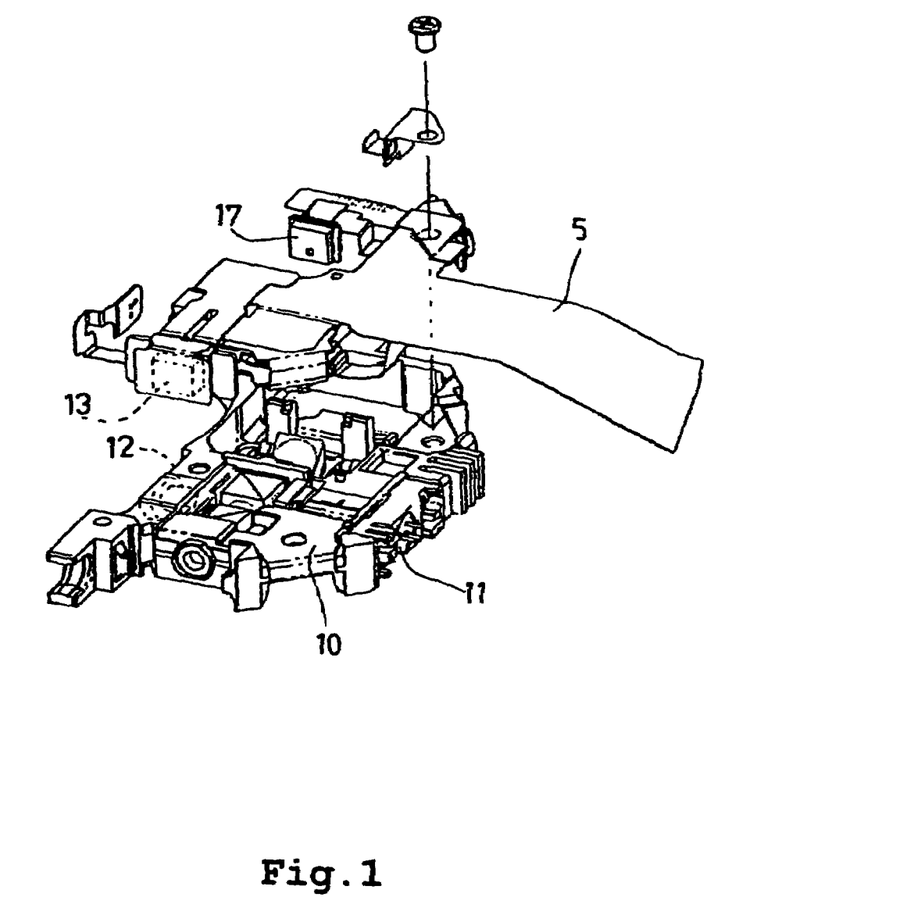
FIG. 1 is a perspective development showing one embodiment of an optical head apparatus according to the present invention.
Figure 2:
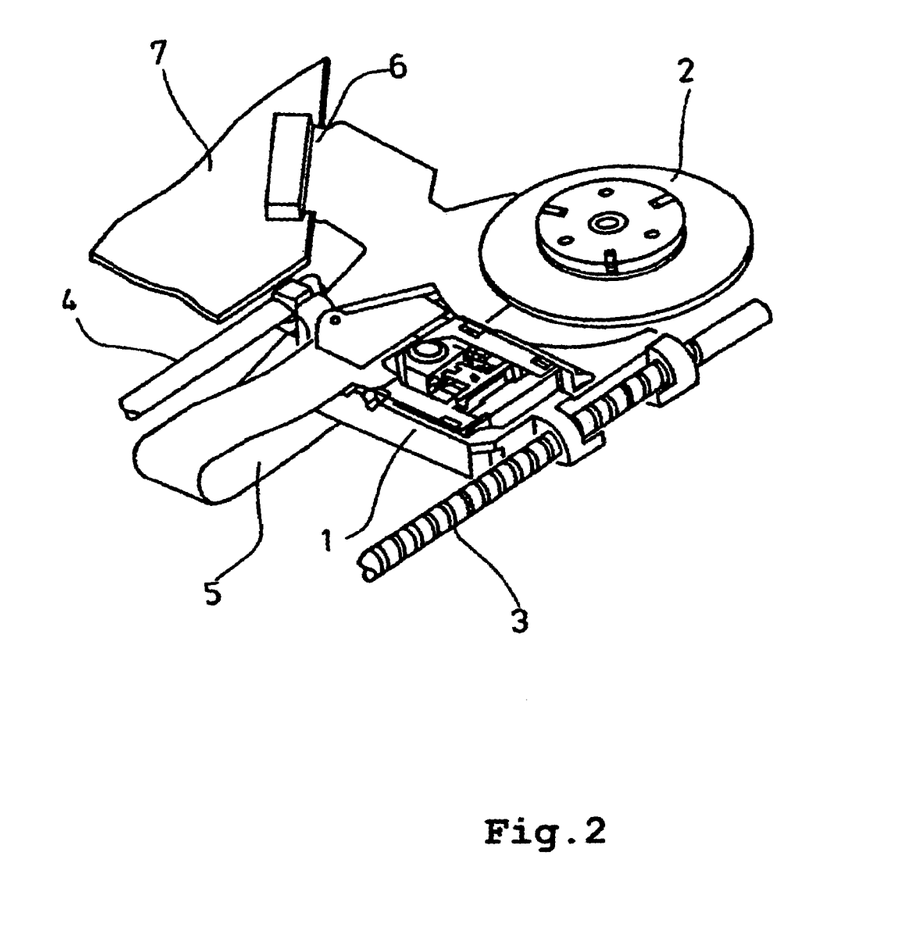
FIG. 2 is a perspective view showing one example in which the optical head apparatus shown in FIG. 1 is applied to an optical disk device.

FIG. 1 is a perspective development showing one embodiment of an optical head apparatus with a flexible circuit board according to the present invention, and FIG. 2 is a perspective view showing one example in which a circuit board placed in an equipment main body and the optical head apparatus with the flexible circuit board shown in FIG. 1 is applied to an optical disk device.

An optical head apparatus 1 is an apparatus for recording and reproducing signals of disks including CDs, DVDs and high-density DVDs (commonly known as HD-DVD). The optical head apparatus 1 is supported by a screw shaft 3 and a shaft guide 4 movable in a direction traversing a signal track of a disk (not shown) mounted on a turntable 2.

A flexible circuit board 5 is drawn out from an upper side of the optical head apparatus 1 in a moving direction of the optical head apparatus 1, and folded back so as to sandwich the optical head apparatus 1 in its thickness direction. A connector portion 6 to be an electric connection to the flexible circuit board 5 is connected to a circuit board 7 placed in an equipment main body, and forms a transmission path connecting the circuit board 7 and the optical head apparatus 1.

The flexible circuit board 5 is configured in such a manner that a conductive pattern of copper foil is formed on a base film made from a resin film of polyimide or the like, and then a cover film made from a resin film of polyimide or the like is covered except a solderable land area of the conductive pattern.

Various electrical components which are mounted on the flexible circuit board 5 or which are incorporated into or mounted in an optical housing 10 of the optical head apparatus 1 are connected to or placed on the flexible circuit board 5. These electrical components include a dual wavelength semiconductor laser 11 comprising in the same casing two laser diodes 11*a* and 11*b* (see FIG. 6) which emit laser lights having a red wavelength and an infrared wavelength adapted to the disks: DVDs and CDs, respectively; a blue semiconductor laser 12 comprising a laser diode 12*a* which emits laser light having a blue wavelength adapted to the high-density DVDs; a photo-detector 13 which receives laser light reflected by the disks; a main circuit 14 (see FIG. 4A, 4B, and 5) of a laser driving semiconductor integrated circuit (laser driver) which drives the laser diodes 11*a* and 11*b* of the dual wavelength semiconductor laser 11 and the laser diode 12*a* of the blue semiconductor laser 12; a first sub circuit 15 and a second sub circuit 16 (see FIG. 4A and 4B) corresponding to the main circuit 14; and a front monitor diode 17 which receives laser lights emitted from the laser diodes in order to maintain the amount of light emission of the laser diodes at a predetermined strength.

Figure 3:
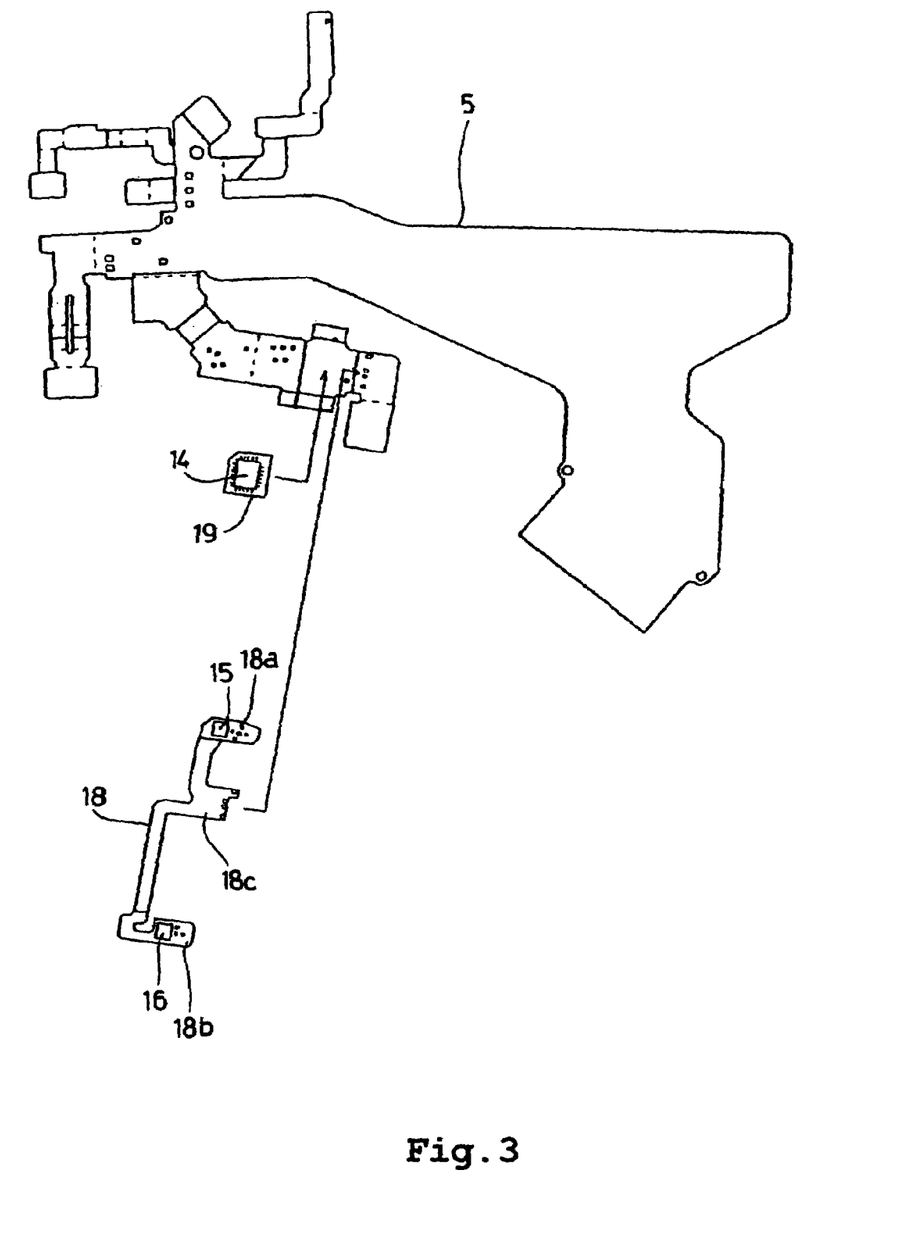
FIG. 3 is a plan view showing the outer shape of a flexible circuit board 5 and explaining how to bend it.

The dual wavelength semiconductor laser 11 and the blue semiconductor laser 12 are connected to a separate sub-circuit board 18 to be placed on the flexible circuit board 5 as shown in FIG. 3, and are indirectly placed on the flexible circuit board 5 through the sub-circuit 18. In this case, ends of the sub-circuit board 18 serve as laser connection areas 18*a*, 18*b* to which the dual wavelength semiconductor laser 11 and the blue semiconductor laser 12 are connected, and a midpoint between the laser connection areas 18*a*, 18*b* is a relay area 18*c* to be connected to the flexible circuit board 5.

In the configuration of FIG. 3, the first sub circuit 15 is placed in the vicinity of a connection area of the flexible circuit board 5 to the dual wavelength semiconductor laser 11 in such a manner as to be partially superimposed over this connection area, and the second sub circuit 16 is placed in the vicinity of a connection area of the flexible circuit board 5 to the blue semiconductor laser 12 in such a manner as to be partially superimposed over this connection area. Otherwise, the first sub circuit 15 may be placed in the vicinity of the connection area of the flexible circuit board 5 to the dual wavelength semiconductor laser 11 without being superimposed over this connection area or may be placed only over the connection area depending on the size of the sub circuit, and the second sub circuit 16 may be placed in the vicinity of the connection area of the flexible circuit board 5 to the blue semiconductor laser 12 without being superimposed over this connection area or may be placed only over the connection area depending on the size of the sub circuit.

Furthermore, a second sub-circuit board 19 to which the main circuit 14 of the laser driver is attached is overlaid and fixed by soldering at a predetermined position of the flexible circuit board 5. This second sub-circuit board 19 comprises a double-sided circuit board, and the main circuit 14 of the laser driver is placed on its front side, and connection lands connected to the flexible circuit board 5 and a wiring pattern traversing the main circuit 14 are formed on its rear side.

The flexible circuit board 5 thus configured and including the sub-circuit board 18 has an outer shape as shown in FIG. 3, and has its full line portion mountain-folded and its broken line portion valley-folded in accordance with the outer shape of the optical head apparatus 1. The various electrical components connected to or placed in the flexible circuit board 5 in accordance with the folding are placed at predetermined portions of the optical head apparatus 1 along the outer shape of the optical housing 10 (see FIG. 2).

Figure 4A:
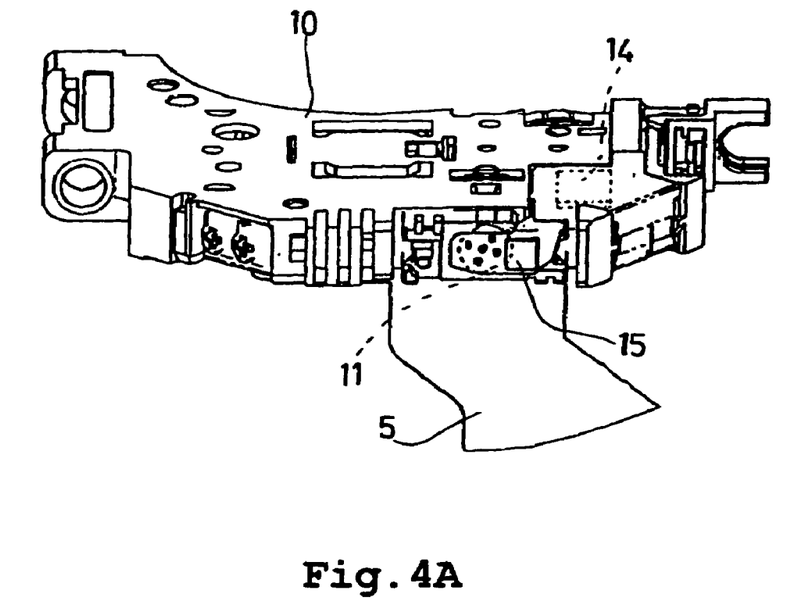
FIG. 4A is perspective view from the rear one side of an optical head apparatus, explaining a dual wavelength semiconductor laser 11 connected to the flexible circuit board 5 to which a sub-circuit board is connected.
Figure 4B:
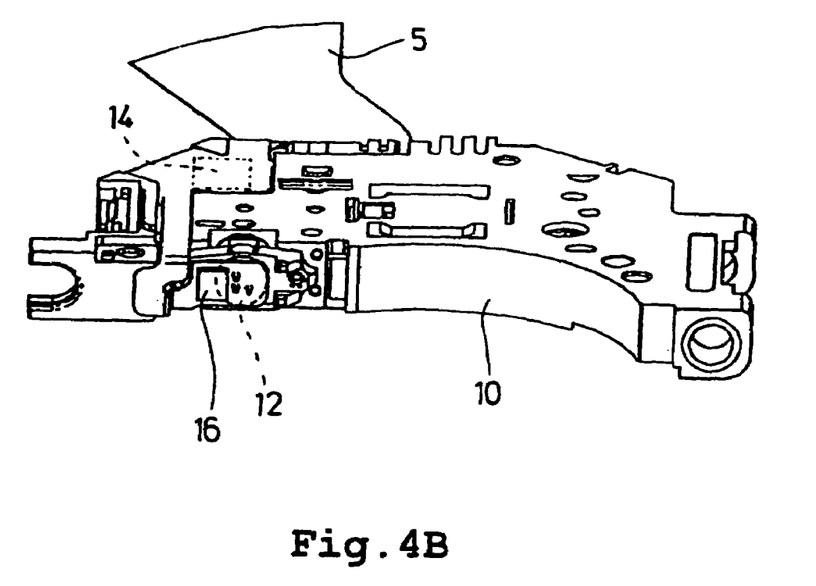
FIG. 4B is perspective view from the rear other side of an optical head apparatus, explaining a blue semiconductor laser 12 connected to the flexible circuit board 5 to which a sub-circuit board is connected.

FIG. 4A and FIG. 4B are views looking at the rear side of the optical head apparatus 1 from different directions. As shown in these drawings, the dual wavelength semiconductor laser 11 and the blue semiconductor laser 12 are incorporated into different sides of the optical housing 10, and the sub-circuit board 18 is connected to terminals of the dual wavelength semiconductor laser 11 and terminals of the blue semiconductor laser 12 (see FIG. 3).

Figure 5:
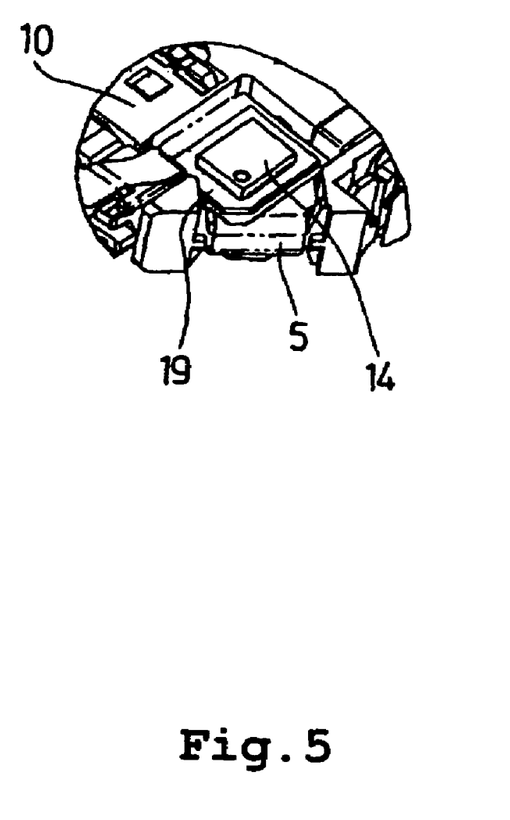
FIG. 5 is a partial perspective view of a predetermined part on the rear side of the optical head apparatus, explaining how a main circuit 14 of a laser driver is placed.

Thus, the photo-detector 13 and the front monitor diode 17 are placed at predetermined positions of the optical head apparatus 1 (see FIG. 1). Further, FIG. 5 is a partial perspective view of a predetermined part on the rear side of the optical head apparatus 1. As shown in FIG. 5, the main circuit 14 of the laser driver is placed at a predetermined corner on the back side of the optical head apparatus 1.

Here, the laser diodes 11*a* and 11*b* of the dual wavelength semiconductor laser 11 are driven by the main circuit 14 and the first sub circuit 15 of the laser driver, and the laser diode 12*a* of the blue semiconductor laser 12 is driven by the main circuit 14 the second sub circuit 16 of the laser driver.

Figure 6:
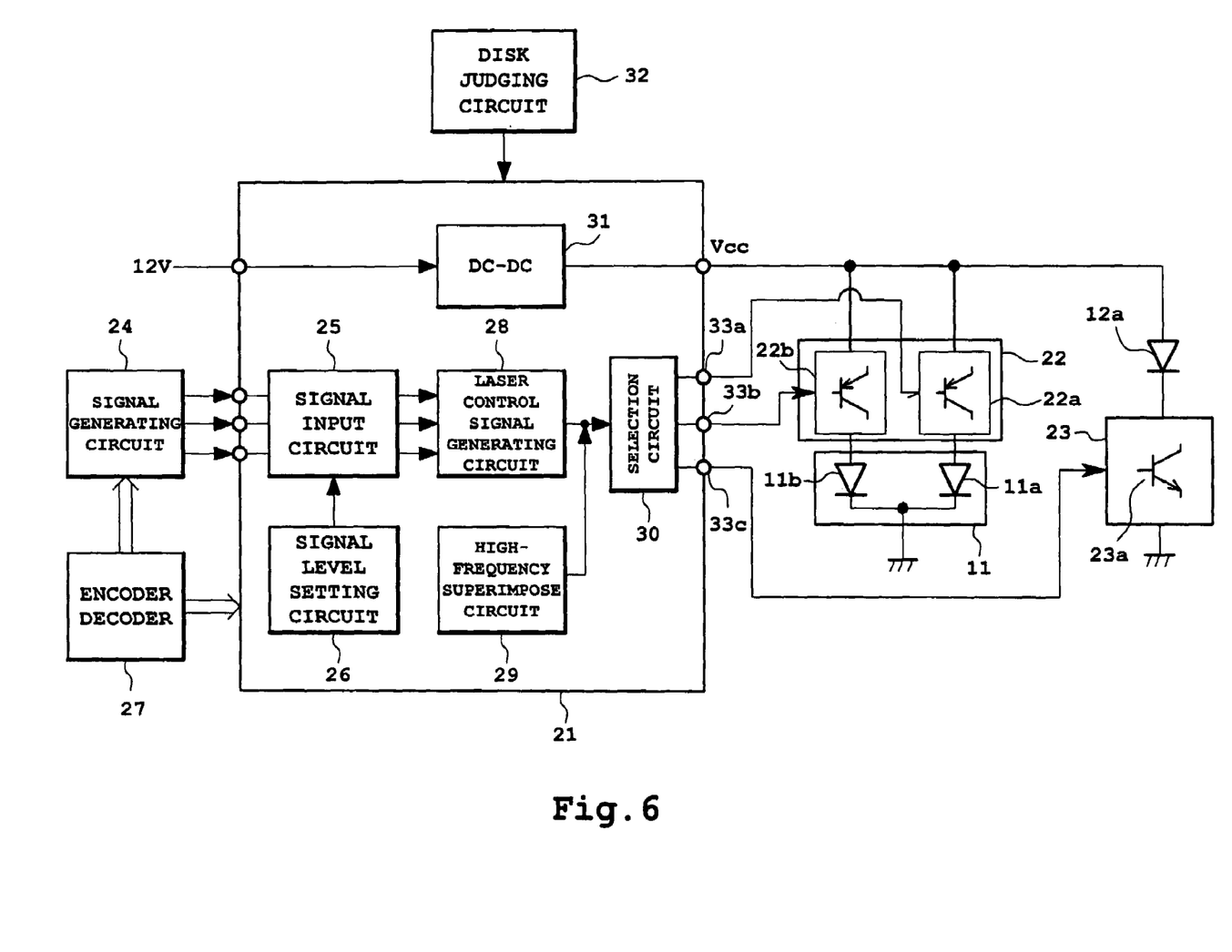
FIG. 6 is a block diagram showing one example of a configuration of the laser driver that drives laser diodes 11a, 11b of the dual wavelength semiconductor laser 11 and a laser diode 12a of the blue semiconductor laser 12.

FIG. 6 is a block diagram showing one example of a configuration of the laser driver that drives the laser diodes 11*a*, 11*b* of the dual wavelength semiconductor laser 11 and the laser diode 12*a* of the blue semiconductor laser 12.

The laser driver is configured to separate into a main circuit 21 (corresponding to the main circuit 14 of the components, see FIG. 5), and a first sub circuit 22 and a second sub circuit 23 (corresponding to the first sub circuit 15 and the second sub circuit 16 of the components, respectively, see FIG. 3, 4A, and 4B). The first sub circuit 22 supplies a drive current to drive the laser diodes 11*a*, 11*b* of the dual wavelength semiconductor laser 11, and the second sub circuit 23 supplies a drive current to drive the laser diode 12*a* of the blue semiconductor laser 12.

The main circuit 21 comprises the following circuits. A signal input circuit 25 is a circuit to which various signals are input from a signal generating circuit 24 that generates the various signals constituting drive pulses' wave-shapes for driving the laser diodes 11*a*, 11*b* of the dual wavelength semiconductor laser 11 and the laser diode 12*a* of the blue semiconductor laser 12. Here, the various signals generated by the signal generating circuit 24 and input to the signal input circuit 25 are a peak power signal, erase power signal and a bottom power signal in RW (ReWritable) recording, a write power signal and a read power signal in R (Recordable) recording, and the read power signal in reproduction. Further, a signal level setting circuit 26 is a circuit which sets the signal current level of the various signals input to the signal input circuit 25.

Furthermore, a laser control signal generating circuit 28 is a circuit which, in recording, synthesizes the various signals input to the signal input circuit 25 to generate, on the basis of recording data encoded by an encoder/decoder 27, a recording laser control signal corresponding to a recording waveform pulse generated in accordance with the RW and R recording, and to generate a reproduction laser control signal to reproduce from the disks.

A high frequency superimpose circuit 29 is a circuit which superimposes a high frequency signal on the laser control signal generated by the laser control signal generating circuit 28.

A selection circuit 30 is a circuit which selectively supplies the input laser control signal to a first final driving stage 22a and a second final driving stage 22b of the first sub circuit 22 and a final driving stage 23a of the second sub circuit 23.

A DC-DC converter 31 is a circuit which converts a power supply voltage applied to the main circuit 21 to generate a direct current power supply voltage to be selectively supplied to the first final driving stage 22a and the second final driving stage 22b of the first sub circuit 22 and the final driving stage 23a of the second sub circuit 23.

In the laser driver thus configured, if a disk judging circuit 32 judges that the disk mounted on the turntable (see FIG. 1) is a CD, the selection circuit 30 is switched to a state to select the first final driving stage 22a of the first sub circuit 22. Further, if the disk is judged to be a DVD, the selection circuit 30 is switched to a state to select the second final driving stage 22b of the first sub circuit 22. Moreover, if the disk is judged to be a high-density DVD, the selection circuit 30 is switched to a state to select the final driving stage 23a of the second sub circuit 23.

Furthermore, the various signals generated by the signal generating circuit 24, setting of the signal current level of the various signals performed by the signal level setting circuit 26, and the oscillation frequency of the high frequency superimpose circuit 29 are changed in accordance with the kind of disk judged by the disk judging circuit 32, the operation state which is either a recording state or a reproduction state, and a set recording/reproduction speed. Therefore, the various signals generated by the signal generating circuit 24, the setting of the signal current level of the various signals performed by the signal level setting circuit 26, and the oscillation frequency of the high frequency superimpose circuit 29 are properly set in accordance with the kind of disk, the operation state and the setting speed. Then, the high frequency signal at a proper oscillation frequency generated by the high frequency superimpose circuit 29 is selectively superimposed on the laser control signal at a proper current level generated by the laser control signal generating circuit 28, and input to the selection circuit 30.

Therefore, each of the first final driving stage 22a, the second final driving stage 22b of the first sub circuit 22 or the final driving stage 23a of the second sub circuit 23 selected by the selection circuit 30 is driven in accordance with the laser control signal from the laser control signal generating circuit 28 on which the high frequency signal is superposed.

When a CD is recorded and reproduced, a laser control signal in a form adapted to the operation state and the setting speed is output from an output terminal 33a of the main circuit 21, the first final driving stage 22a of the first sub circuit 22 is controlled by this laser control signal. Thereby, a drive current is supplied to the CD laser diode 11a of the dual wavelength semiconductor laser 11 in accordance with the laser control signal, and the laser diode 11a emits light at a strength corresponding to this drive current.

Furthermore, when a DVD is recorded and reproduced, a laser control signal in a form adapted to the operation state and the setting speed is output from an output terminal 33b of the main circuit 21, and the second final driving stage 22b of the first sub circuit 22 is controlled by this laser control signal. As a result, a drive current is supplied to the DVD laser diode 11b of the dual wavelength semiconductor laser 11 in accordance with the laser control signal, and the laser diode 11b emits light at a strength corresponding to this drive current.

Still further, when a high-density DVD is recorded and reproduced, a laser control signal in a form adapted to the operation state and the setting speed is output from an output terminal 33c of the main circuit 21, and the final driving stage 23a of the second sub circuit 23 is controlled by this laser control signal. As a result, a drive current is supplied to the laser diode 12a of the blue semiconductor laser 12 in accordance with the above-mentioned waveform pulse, and the laser diode 12a emits light at a strength corresponding to this drive current.

Moreover, the DC-DC converter 31 switches the direct current power supply voltage to be generated, in accordance with the disk judgment made by the disk judging circuit 32.

The on-voltage of the laser diodes changes depending on the frequency to emit light and the light intensity. In this case, the on-voltage becomes higher in the following order: for example, 2 V in the CD laser diode 11a, 3 V in the DVD laser diode 11b and 5 V in the high-density DVD laser diode 12a. Therefore, if the power supply voltages of the first final driving stage 22a and the second final driving stage 22b of the first sub circuit 22 that supply the drive current for the CD laser diode 11a and the DVD laser diode 11b are set in accordance with the high-density DVD laser diode 12a whose on-voltage is the highest, the first final driving stage 22a and the second final driving stage 22b cause the loss of electric power.

In the present embodiment, when the disk judging circuit 32 judges that the kind of disk is a CD, the DC-DC converter 31 generates a direct current power supply voltage of 3.5 V which is 1.5 V higher than a on-voltage of 2 V of the CD laser diode 11a considering the operation voltage of the first final driving stage 22a of the first sub circuit 22. When the disk kind is judged to be a DVD, the DC-DC converter 31 generates a direct current power supply voltage of 4.5 V which is 1.5 V higher than an on-voltage of 3 V of the DVD laser diode 11b considering the operation voltage of the second final driving stage 22b of the first sub circuit 22. When the disk type is judged to be a high-density DVD, the DC-DC converter 31 generates a direct current power supply voltage of 7 V which is 2 V higher than an on-voltage of 5 V of the high-density DVD laser diode 12a considering the operation voltage of the final driving stage 23a of the second sub circuit 23.

Thus, the electric power is not wastefully consumed in the first final driving stage 22a and the second final driving stage 22b of the first sub circuit 22.

Furthermore, the first final driving stage 22a and the second final driving stage 22b of the first sub circuit 22 comprise PNP transistors, and cathodes of the CD laser diode 11a and the DVD laser diode 11b are grounded. On the other hand, the final driving stage 23a of the second sub circuit 23 comprises an NPN transistor, and the high-density DVD laser diode 12a is floated. Thus, the high-density DVD laser diode 12a can be driven in a manner suitable for a higher on-voltage and for reducing adverse effects due to a larger capacity components than those of the other laser diodes 11a, 11b.

It is to be noted that in the case of configuring using CMOS, the first final driving stage 22a and the second final driving stage 22b of the first sub circuit 22 may comprise P-channel FETs, and the final driving stage 23a of the second sub circuit 23 may comprise an N-channel FET.

What is claimed is:

1. An optical head apparatus comprising first and second semiconductor lasers to emit laser lights adapted to different first and second recording media, respectively, in which a laser driver circuit for driving the first and second semiconductor lasers is placed in a flexible circuit board connected to the first and second semiconductor lasers, wherein the laser driver circuit includes a main circuit which is shared by the first and second semiconductor lasers and which generates a control signal to drive the first and second semiconductor lasers, and at least a first sub circuit and a second sub circuit, each having first and second final driving stages which drive the first and second semiconductor lasers, respectively, in accordance with the control signal supplied from the main circuit;

the main circuit includes a selection circuit which selectively supplies the control signal to the sub circuits to be operated in conformity with the kind of recording medium; and the main circuit is placed at a predetermined position of the flexible circuit board; the first sub circuit is placed closer to a first connection area to the first semiconductor laser of the flexible circuit board than the main circuit or placed on the first connection area; and the second sub circuit is placed closer to a second connection area to the second semiconductor laser of the flexible circuit board than the main circuit or placed on the second connection area.

2. The optical head apparatus according to claim 1, wherein the main circuit of the laser driver circuit comprises a high frequency superimpose circuit.

3. An optical head apparatus comprising first and second semiconductor lasers to emit laser lights adapted to different first and second recording media, respectively, in which a laser driver circuit for driving the first and second semiconductor lasers is placed in a flexible circuit board connected to the first and second semiconductor lasers, wherein the laser driver circuit includes a main circuit which is shared by the first and second semiconductor lasers and which generates a control signal to drive the first and second semiconductor lasers, and at least a first sub circuit and a second sub circuit, each having first and second final driving stages which drive the first and second semiconductor lasers, respectively, in accordance with the control signal supplied from the main circuit;

the main circuit includes a selection circuit which selectively supplies the control signal to the sub circuits to be operated in conformity with the kind of recording medium; and the main circuit is placed at a predetermined position of the flexible circuit board; the first sub circuit is placed closer to a first connection area to the first semiconductor laser of the flexible circuit board than the main circuit or placed on the first connection area; and the second sub circuit is placed closer to a second connection area to the second semiconductor laser of the flexible circuit board than the main circuit or placed on the second connection area, wherein the main circuit of the laser driver circuit comprises a DC-DC converter which supplies a direct current power supply voltage to the first and second sub circuits, and the DC-DC converter switches, in accordance with the kind of recording medium, the power supply voltage to be supplied to each of the sub circuits to a value which is set in consideration of an on-voltage of the laser diode constituting the semiconductor laser adapted to the recording medium.

4. An optical head apparatus comprising first and second semiconductor lasers to emit laser lights adapted to different first and second recording media, respectively, in which a laser driver circuit for driving the first and second semiconductor lasers is placed in a flexible circuit board connected to the first and second semiconductor lasers, wherein the laser driver circuit includes a main circuit which is shared by the first and second semiconductor lasers and which generates a control signal to drive the first and second semiconductor lasers, and at least a first sub circuit and a second sub circuit, each having first and second final driving stages which drive the first and second semiconductor lasers, respectively, in accordance with the control signal supplied from the main circuit;

the main circuit includes a selection circuit which selectively supplies the control signal to the sub circuits to be operated in conformity with the kind of recording medium; and the main circuit is placed at a predetermined position of the flexible circuit board; the first sub circuit is placed closer to a first connection area to the first semiconductor laser of the flexible circuit board than the main circuit or placed on the first connection area; and the second sub circuit is placed closer to a second connection area to the second semiconductor laser of the flexible circuit board than the main circuit or placed on the second connection area, wherein the laser driver circuit comprises a single main circuit and plurality of sub circuits, and NPN and PNP transistors or N-channel and P-channel FETs are suitably used to configure each of the sub circuits in accordance with the on-voltage of the laser diode driven by each of the sub circuits.

* * * * *